United States Patent [19]

Yoshida et al.

[11] 4,179,671
[45] Dec. 18, 1979

[54] CAPACITOR SWITCHING CIRCUITS FOR ADJUSTING CRYSTAL OSCILLATOR FREQUENCY

[75] Inventors: Hirohiko Yoshida, Hoya; Fumio Nakajima, Tokyo, both of Japan

[73] Assignee: Citizen Watch Company Limited, Japan

[21] Appl. No.: 866,420

[22] Filed: Jan. 3, 1978

[30] Foreign Application Priority Data

Jan. 10, 1977 [JP] Japan .................................. 52-841
Jan. 12, 1977 [JP] Japan .................................. 52-2151

[51] Int. Cl.² ............................................. H03B 5/36
[52] U.S. Cl. ........................ 331/116 FE; 307/247 R; 307/304; 331/158; 331/179
[58] Field of Search ............. 331/116 R, 179, 158, 331/116 FE; 307/247 R, 304

[56] References Cited

U.S. PATENT DOCUMENTS

| 3,457,435 | 7/1969 | Burn et al. ........................... 307/304 |
| 4,001,606 | 1/1977 | Dingwall .......................... 307/247 R |
| 4,016,505 | 4/1977 | Kobori ............................. 331/116 R |

*Primary Examiner*—Siegfried H. Grimm

[57] ABSTRACT

A piezo-electric oscillator composed of a quartz crystal, an inverting amplifier connected across the quartz crystal, an output capacitor connected to an output side of the quartz crystal, and a plurality of input capacitors. The input capacitors are selectively coupled to the input side of the quartz crystal by means of an electronic switching means by which an output frequency of the quartz crystal is adjusted to a prescribed value.

1 Claim, 4 Drawing Figures

CAPACITOR SWITCHING CIRCUITS FOR ADJUSTING CRYSTAL OSCILLATOR FREQUENCY

BACKGROUND OF THE INVENTION

This invention relates to a piezo-electric oscillator, and more particularly to a piezo-electric oscillator the frequency of which is adjusted by means of a capacitor.

In the past, the frequency of a crystal controlled oscillator especially for use in a wristwatch was accomplished by employing a laser to remove a portion of a thin metallic film disposed on a quartz crystal vibrator. This method was adopted in place of an adjustment method using a trimmer capacitor in order to lower costs and make more efficient use of space. However, a number of disadvantages were encountered. Specifically, once the oscillator was set to the prescribed frequency, the effects of aging, mechanical impact or supporting errors would often cause the frequency to increase. Restoring the frequency to the prescribed value using laser trimming was a difficult operation.

SUMMARY OF THE INVENTION

It is, therefore, an object of the present invention to provide a piezo-electric oscillator which can overcome the shortcomings encountered in the prior art.

It is another object of the present invention to provide a piezo-electric oscillator the frequency of which can be readily adjusted by facilitating the connection between a plurality of capacitors.

BRIEF DESCRIPTION OF THE DRAWINGS

These and other objects, features and advantages of the present invention will become more apparent from the following description when taken in conjunction with the accompanying drawings, in which.

DESCRIPTION OF THE PREFERRED EMBODIMENTS

Figure 1:
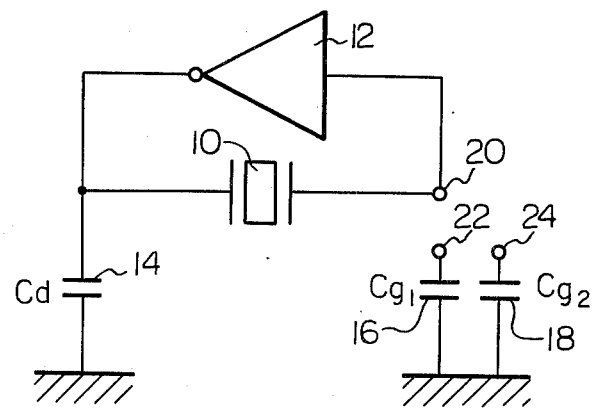
FIG. 1 is a wiring diagram of a prior art piezo-electric oscillator.

FIG. 1 illustrates an example of a conventional Colpitts crystal controlled oscillator, in which reference numeral 10 denotes a quartz crystal, 12 an inverting amplifier connected across the quartz crystal, 14 a capacitor Cd connected to an output side of the vibrator 10, and reference numerals 16, 18 designate capacitors the values $Cg_1$, $Cg_2$ of which are related by the inequality $Cg_1 < Cg_2$. Reference numeral 20 represents a quartz crystal input terminal, and reference numerals 22, 24 denote terminals of capacitors 16, 18 corresponding to the input terminal 20.

The oscillator circuit is initially operated by connecting terminals 20 and 22 by means of a wire lead. The quartz crystal oscillator which is arranged so as to initially oscillate at a frequency lower than the intended operating frequency is irradiated by a laser beam during oscillation to remove a portion of the metallic film on the vibrator so as to raise its oscillating frequency to the prescribed value. Next, in a case where the oscillating frequency increases further due to the effects of aging or the like, the connection between terminals 20, 22 is replaced by a connection between terminals 20, 24. Once the frequency has dropped below the prescribed value, the above-mentioned laser irradiation treatment is once again employed to further remove the metallic film and thus restore the prescribed frequency.

Although this arrangement allows a restoration of the desired frequency, bonding operations are time consuming and the required bonding pads call for additional space.

The present invention contemplates to greatly reduce labor and space requirements and make it possible to restore a prescribed frequency in an extremely simple manner.

Figure 2:
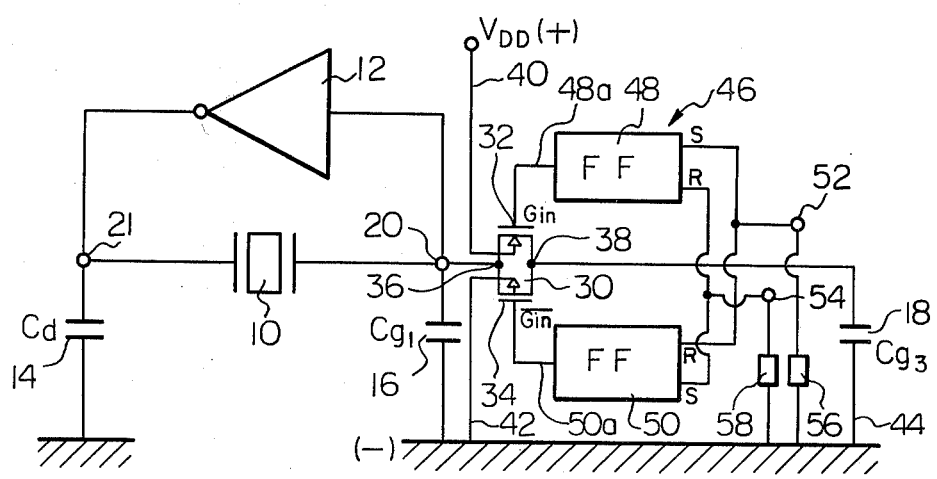
FIG. 2 is a wiring diagram of a preferred embodiment of a piezo-electric oscillator according to the present invention.

Referring now to FIG. 2, there is shown a preferred embodiment of a piezo-electric oscillator according to the present invention, with like parts bearing the same reference numerals as those used in FIG. 1. In FIG. 2, the piezo-electric oscillator comprises a quartz crystal 10 having an input terminal 20 and an output terminal 21, an inverting amplifier 12 connected across the input and output terminals 20 and 21 of the quartz crystal 10. An output capacitor 14 is coupled to the output terminal 21 of the quartz crystal. In the illustrated embodiment of FIG. 2, a first input capacitor 16 is normally coupled to the input terminal of the quartz crystal 10, and a second input capacitor 18 is selectively coupled to the input terminal 20 of the quartz crystal 10 by means of an electronic switching means 30 connected therebetween. The electronic switching means 30 is shown as comprising a transmission gate including an N-channel transistor 32 and a P-channel transistor 34 connected source-to-source at 36 and drain-to-drain at 38. The N-channel transistor 32 has its substrate coupled to a positive power supply terminal 40, and the P-channel transistor 34 has its substrate coupled to the other or grounded side of the power supply as indicated at 42. Common source terminal 36 of the transmission gate 30 is coupled to the input terminal 20 of the quartz crystal 10. Common drain terminal 38 of the transmission gate 30 is coupled to one electrode of the second input capacitor 18, whose another electrode is coupled to the grounded side of the power supply as indicated at 44. The transmission gate 30 thus arranged is controlled by a change-over means 46. The change-over means 46 is shown as comprising first and second R-S type flip-flops 48 and 50. The first flip-flop 48 has a set terminal coupled to a first control terminal 52 to which a reset terminal of the second flip-flop 50 is also coupled. Likewise, the second flip-flop 50 has a set terminal coupled to a second control terminal 54 to which a reset terminal of the first flip-flop 48 is also coupled. The first and second control terminals 52 and 54 are adapted to be supplied with an input pulse from any suitable means such as a pulse generator. Reference numerals 56 and 58 indicate resistors connected to the first and second control terminals 52, 54, respectively. Output 48a of the first flip-flop 48 is coupled to the gate terminal of the N-channel transistor 32, and output 50a of the second flip-flop 50 is coupled to the gate terminal of the P-channel transistor 34.

In operation, when an input pulse is applied solely to the control terminal 54, the second flip-flop 50 is set while the first flip-flop 48 is reset. In this instance, the output 50a of the second flip-flop 50 is at 1 logic level while the output 48a of the first flip-flop 48 is at a 0 logic level. Under this circumstance, the transmission gate 30 is in OFF state so that electrical connection between the input terminal 20 of the quartz crystal 10 and the second input capacitor 18 is interrupted and accordingly an operating frequency of the quartz crystal 10 is influenced only by the capacitance $Cg_1$ of the first input capacitor 16. Under this condition, the operating frequency of the quartz crystal 10 is adjusted to a prescribed value in the same manner as previously noted with reference to FIG. 1. During adjustment of the operating frequency, if the operating frequency of the quartz crystal 10 is caused to shift in a positive direction, i.e., if the operating frequency exceeds beyond the prescribed value for some reason, the operating frequency can be easily adjusted and brought down to the prescribed value merely by applying an input pulse to the first control terminal 52. The application of such a pulse to the first control terminal 52 causes the first flip-flop 48 to be set and causes the second flip-flop 50 to be reset. In this case, the output 48a of the first flip-flop 48 goes to 1 logic level while the output 50a of the second flip-flop 50 goes to a 0 logic level. Consequently, the transmission gate 30 is rendered to be ON so that the second input capacitor 18 is coupled to the input terminal 20 of the quartz crystal 10. This raises the input capacitance from $Cg_1$ to $Cg_1 + Cg_3$, thereby providing the desired frequency adjustment.

It is to be noted that the application of the input pulse to the control terminal 16 may be readily performed during the construction of the oscillator without requiring any special apparatus or space. If it is desired to install the oscillator in an electronic timepiece, discrepancies in the operating frequency due to temperature changes can be compensated for by applying an input pulse from outside with the use of an external control member such as a push-button associated with a battery accommodated in the timepiece.

Figure 3:
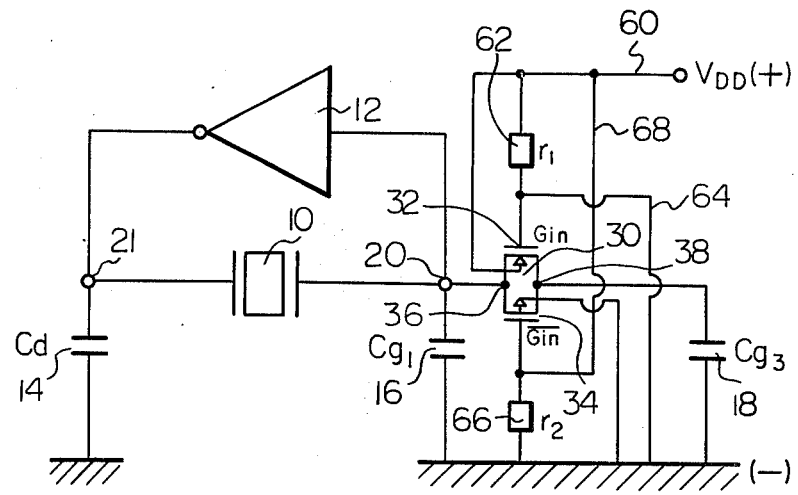
FIG. 3 is a wiring diagram of another preferred embodiment of a piezo-electric oscillator according to the present invention.

FIG. 3 illustrates another preferred embodiment of a piezo-electric oscillator according to the present invention, with like or corresponding component parts bearing the same reference numerals as those used in FIG. 2. The illustrated embodiment of FIG. 3 is identical to that of FIG. 2 except that the gate terminal Gin of the N-channel transistor 32 is connected to the positive power supply terminal 60 through a resistor 62, and directly to the negative power supply side as indicated at 64. The gate terminal $\overline{Gin}$ of the P-channel transistor 34 is connected to the negative power supply side through a resistor 66, and directly to the positive side 60 of the power supply. In this state, the transmission gate 30 is maintained in an OFF state so that the second input capacitor 18 is uncoupled to the input terminal 20.

In the state shown in FIG. 3, the operating frequency is adjusted to a prescribed value by irradiating a portion of a metallic film on the quartz crystal 10 by a laser beam. If, in this case, the operating frequency exceeds the prescribed value, the frequency can be readjusted and brought down to the prescribed value merely by using laser trimming or other suitable means to cut the wire lead 64 connecting the gate terminal Gin to the negative side of the power supply, and the wire lead 68 connecting the gate terminal $\overline{Gin}$ to the positive side of the power supply. This operation raises Gin to a 1 logic level and brings $\overline{Gin}$ to a 0 logic level, thereby turning the transmission gate 30 ON and thus connecting the second capacitor 18 to the input terminal 20. This raises the input capacitance from $Cg_1$ to $Cg_1 + Cg_3$, thereby providing the desired frequency adjustment.

Figure 4:
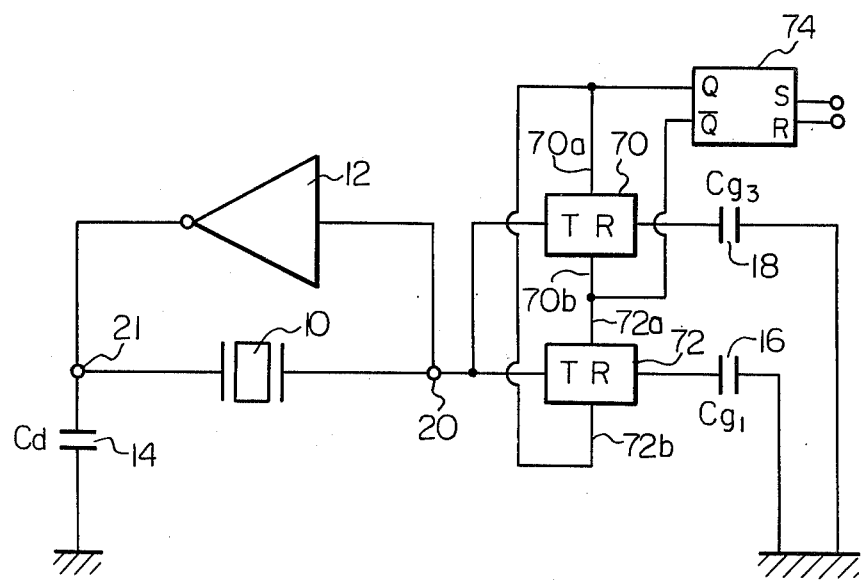
FIG. 4 is a wiring diagram of still another preferred embodiment of a piezo-electric oscillator according to the present invention.

FIG. 4 shows still another preferred embodiment of the present invention, with like parts bearing the same reference numerals as those used in FIG. 2. In this illustrated embodiment, the first and second capacitors 16 and 18 are selectively coupled to the input terminal 20 of the quartz crystal 10. To this end, a first switching means composed of a transmission gate 72 is connected between the input terminal 20 of the quartz crystal 10 and the first capacitor 16, while a second switching means composed of a transmission gate 70 is connected between the input terminal 20 of the quartz crystal 10 and the second capacitor 18. The transmission gates 70 and 72 are controlled by a change-over means composed of an S-R type flip-flop 74. The flip-flop 74 has its Q output coupled to a first control gate terminal 70a of the second transmission gate 70 and a second control gate terminal 72b of the first transmission gate 72. A second control gate terminal 70b of the second transmission gate 70 and a first control gate terminal 72a of the first transmission gate 72 are connected together and also connected to the $\overline{Q}$ output of the flip-flop 74. When the flip-flop 74 is in a reset condition, the Q output of the flip-flop is at a 0 logic level and the $\overline{Q}$ output is at a 1 logic level. In this case, the first transmission gate 72 is conductive while the second transmission gate 70 is nonconductive. Therefore, only the first capacitance 16 is coupled to the input terminal 20 of the quartz crystal 10 and, thus, the input capacitance is $Cg_1$. Under this condition, the frequency adjustment of the quartz crystal 10 is performed in a similar manner as previously mentioned. If, in this instance, the output frequency of the quartz crystal 10 exceeds beyond a prescribed value, re-adjustment of the output frequency of the quartz crystal 10 can be made by actuating the flip-flop 74. To this end, the set terminal S of the flip-flop 74 is applied with an input pulse so that the flip-flop 74 is set. Accordingly, the Q output of the flip-flop 74 goes to a 1 logic level while the $\overline{Q}$ output goes to a 0 logic level. In this case, the transmission gate 70 is rendered conductive and the transmission gate 72 is rendered nonconductive. Under this circumstance, only the second capacitor 18 is coupled to the input terminal 20 of the quartz crystal 10 and the input capacitance $Cg_3$ is greater than the input capacitance $Cg_1$ so that the output frequency of the quartz crystal 10 is brought down to the prescribed value.

In illustrated embodiments illustrated in FIGS. 2, 3 and 4, only two capacitors are provided on the input side of the quartz crystal; however, it should be understood that the present invention is not limited to this arrangement. More than two capacitors may be provided on the input side of the quartz crystal and selectively coupled thereto.

While the input capacitors have been shown and described as being solely connected to the input terminal of the quartz crystal, it should be noted that selected ones of a plurality of capacitors may be connected in series with the input terminal of the quartz crystal.

What is claimed is:
1. A piezo-electric oscillator comprising:
   a quartz crystal having input and output terminals;
   an inverting amplifier connected across the input and output terminals of said quartz crystal;
   a first capacitor normally connected to the input terminal of said quartz crystal;
   a second capacitor; and electronic switching means connected between said input terminal of said quartz crystal and said second capacitor for controlling connection of said second capacitor relative to the input terminal of said quartz crystal for thereby adjusting an operating frequency of said quartz crystal to a prescribed value, said electronic switching means comprising a transmission gate having first and second control gate terminals, a first resistor, said first control gate terminal of said transmission gate being connected to the positive side of a power supply through said first resistor, a second resistor, said second control gate terminal of said transmission gate being connected to the negative side of said power supply through said second resistor, a first lead connecting said first control gate terminal directly to the negative side of said power supply, a second lead connecting said second control gate terminal directly to the positive side of said power supply, whereby said transmission gate is nonconductive to interrupt connection between the input terminal of said quartz crystal and said second capacitor, and said first and second leads being cut by a laser trimming to allow said transmission gate to turn on for thereby connecting said second capacitor to the input terminal of said quartz crystal to adjust the operating frequency thereof.

* * * * *